United States Patent
Schrank et al.

(10) Patent No.: US 8,658,534 B2
(45) Date of Patent: Feb. 25, 2014

(54) METHOD FOR PRODUCING A SEMICONDUCTOR COMPONENT, AND SEMICONDUCTOR COMPONENT

(75) Inventors: Franz Schrank, Graz (AT); Günther Koppitsch, Lieboch (AT); Michael Beutl, Graz (AT); Sara Carniello, Graz (AT); Jochen Kraft, Oberaich (AT)

(73) Assignee: AMS AG, Unterpremstaetten (AT)

( * ) Notice: Subject to any disclaimer, the term of this patent is extended or adjusted under 35 U.S.C. 154(b) by 166 days.

(21) Appl. No.: 13/054,614

(22) PCT Filed: Jun. 25, 2009

(86) PCT No.: PCT/EP2009/058001
§ 371 (c)(1),
(2), (4) Date: Apr. 14, 2011

(87) PCT Pub. No.: WO2010/006916
PCT Pub. Date: Jan. 21, 2010

(65) Prior Publication Data
US 2011/0260284 A1    Oct. 27, 2011

(30) Foreign Application Priority Data
Jul. 16, 2008   (DE) .................. 10 2008 033 395

(51) Int. Cl.
*H01L 21/44* (2006.01)
(52) U.S. Cl.
USPC ............... 438/667; 438/706; 257/E21.597
(58) Field of Classification Search
USPC .............................................. 438/641
See application file for complete search history.

(56) References Cited

U.S. PATENT DOCUMENTS

| | | | |
|---|---|---|---|
| 5,426,072 | A | 6/1995 | Finnila |
| 5,511,428 | A | 4/1996 | Goldberg et al. |
| 5,741,733 | A | 4/1998 | Bertagnolli et al. |
| 5,766,984 | A | 6/1998 | Ramm et al. |
| 6,110,825 | A | 8/2000 | Mastromatteo et al. |
| 6,159,833 | A | 12/2000 | Lee et al. |
| 6,242,319 | B1 | 6/2001 | Hofmann et al. |
| 6,252,300 | B1 | 6/2001 | Hsuan et al. |
| 6,323,546 | B2 | 11/2001 | Hsuan et al. |
| 6,352,923 | B1 | 3/2002 | Hsuan et al. |
| 6,483,147 | B1 | 11/2002 | Lin |

(Continued)

FOREIGN PATENT DOCUMENTS

| | | |
|---|---|---|
| CA | 1057411 | 6/1979 |
| DE | 4400985 C1 | 5/1995 |

(Continued)

OTHER PUBLICATIONS

Chow, et al., "Process Compatible Polysilicon-Based Electrical Through-Wafer Interconnects In Silicon Substrates," Journal of Microelectromechanical Systems, Dec. 2002, pp. 631-640, vol. 11, No. 6.

(Continued)

*Primary Examiner* — Cheung Lee
(74) *Attorney, Agent, or Firm* — McDermott Will & Emery LLP

(57) ABSTRACT

In an insulation layer of an SOI substrate, a connection pad is arranged. A contact hole opening above the connection pad is provided on side walls and on the connection pad with a metallization that is contacted on top side with a top metal.

11 Claims, 4 Drawing Sheets

(56) References Cited

U.S. PATENT DOCUMENTS

| | | |
|---|---|---|
| 6,943,067 B2 | 9/2005 | Greenlaw |
| 7,339,273 B2 | 3/2008 | Kameyama et al. |
| 7,492,009 B2 | 2/2009 | Kawahigashi |
| 2005/0059204 A1 | 3/2005 | Heschel |
| 2005/0090096 A1 | 4/2005 | Hou et al. |
| 2005/0156330 A1 | 7/2005 | Harris |
| 2007/0241457 A1 | 10/2007 | Ida |
| 2008/0157394 A1 | 7/2008 | Kwon et al. |
| 2008/0166857 A1 | 7/2008 | Costrini |

FOREIGN PATENT DOCUMENTS

| | | |
|---|---|---|
| DE | 4433846 C2 | 3/1996 |
| DE | 19904571 C1 | 4/2000 |
| DE | 10200399 | 7/2003 |
| DE | 10351201 B3 | 7/2005 |
| EP | 0316 799 | 5/1989 |
| JP | 08-241969 | 9/1996 |
| JP | 10-027793 | 1/1998 |
| JP | 2001-116768 A | 4/2001 |
| JP | 2005-116623 A | 4/2005 |
| JP | 2006-128172 A | 5/2006 |
| JP | 2007/305960 A | 11/2007 |
| WO | WO 2006/097842 | 9/2006 |

OTHER PUBLICATIONS

Vardaman, J., "3-D Through-Silicon Vias Become a Reality," Semiconductor International, Jun. 1, 2007 *Business Insights: Essentials*. Retrieved from <http://bi.galegroup.com/essentials/article/GALE%7CA164627024/70f2087d63b841909df664d67472dd02?u=usocal_main>.

Wu, et al., "A Through-Wafer Interconnect in Silicon for RFICs," IEEE Transactions on Electronic Devices, Nov. 2004, pp. 1765-1771 vol. 51, No. 11.

Lietaer, et al., "Development of cost-effective high-density through-wafer interconnects for 3D microsystems," Journal of Micromechanics and Microengineering, 2006, pp. 29-34.

Rowbotham, et al., "Back side exposure of variable size through silicon vias," J. Vac. Sci. Technol., Sep./Oct. 2006, pp. 2460-2466, B24(5).

METHOD FOR PRODUCING A SEMICONDUCTOR COMPONENT, AND SEMICONDUCTOR COMPONENT

RELATED APPLICATIONS

This is a U.S. national stage of application No. PCT/EP2009/058001, filed on Jun. 25, 2009.

This application claims the priority of German application no. 10 2008 033 395.6 filed Jul. 16, 2008, the entire content of which is hereby incorporated by reference.

FIELD OF THE INVENTION

The present invention relates to the manufacture of via contacts through semiconductor substrates. Electrically conductive connections between the top side and the bottom side of a semiconductor substrate are used for the vertical integration of semiconductor components.

BACKGROUND OF THE INVENTION

For the connection of multiple semiconductor components, semiconductor chips can be arranged one next to the other and can be connected in an electrically conductive way to each other by wires, or multiple semiconductor chips can be arranged stacked vertically one above the other and can be connected to each other by electrical connection contacts on the top sides and bottom sides. When the semiconductor chips are stacked, electrically conductive connections must be established through the substrate from the top side of each chip to the bottom side. For this purpose, holes are typically etched into the substrate, wherein these holes are then filled with an electrically conductive material, typically a metal. If the electrical conductor is established so that it does not reach up to the back side of the substrate, then the substrate is thinned from the back side by grinding until the conductive material of the contact-hole filling is exposed and the via contact is created. On the surfaces of the substrate, metal layers can be deposited as connection metalization and can be structured corresponding to the provided connections. When the chips are stacked, the connection contact faces allocated to each other are arranged one above the other and are connected to each other permanently in an electrically conductive way, for example, by means of a solder. (J. Vardaman, "3-D Through-Silicon Vias Become a Reality," Semiconductor International, Jun. 1, 2007)

Typical approaches create via contacts with diameters of 10 μm to 50 μm, wherein the contact holes are filled with copper (T. Rowbotham et al., "Back side exposure of variable size through silicon vias," J. Vac. Sci. Techn. B24(5), 2006) or polycrystalline silicon (E. M. Chow et al., "Process compatible polysilicon-based electrical through-wafer interconnects in silicon substrates," J. of Micromechanical Systems, Vol. 11, No. 6, 2002; J. H. Wu et al., "Through-Wafer Interconnect in Silicon for RFICs," IEEE Trans. on El. Dev. 51, No. 11, 2004) or covered with organic material (N. Lietaer et al., "Development of cost-effective high-density through-wafer interconnects for 3-D microsystems," J. of Micromechanics and Microengineering 16, S29-S34, 2006).

Large-dimensioned via contacts in semiconductor wafers are created, for example, through the etching of large cutouts with angled side walls, for example, under the use of KOH. A metal layer deposited in the cutout is exposed from the opposite top side of the wafer and is provided there with a contact. Conventional methods are described in US 2005/156330, US 2005/090096, U.S. Pat. Nos. 6,323,546, 6,483,147, 6,159, 833, JP 2001 116768, U.S. Pat. Nos. 6,352,923, 6,252,300, 6,110,825, 5,511,428, and CA 1 057 411.

SUMMARY OF THE INVENTION

It is an object of the present invention to disclose improved methods and structures for the economical manufacture of via contacts through semiconductor substrates that can be applied, in particular, also for thicker wafers of typically greater than 100 μm thickness. An associated manufacturing method is to be carried out with processing steps of a standard CMOS process.

In the case of the via contacts according to an embodiment of the invention, it is provided to coat only the side walls and the base of a contact hole with electrically conductive material. In the case of preferred embodiments, a dielectric layer, a metallization, and a passivation are deposited. With the exception of the contact hole etching, the processing steps used belong to standard CMOS processes. For example, via contacts with typical diameters of 100 μm in a substrate with a typical thickness of approximately 250 μm can be realized.

BRIEF DESCRIPTION OF THE DRAWINGS

Below is a more detailed description of examples of the semiconductor component and the manufacturing method with reference to the accompanying figures.

DETAILED DESCRIPTION OF THE DRAWINGS

A preferred embodiment of the semiconductor component will now be described with reference to a preferred manufacturing method. In the case of this embodiment, it is assumed that the semiconductor component comprises a CMOS circuit. The CMOS circuit is integrated in a substrate that has the structure of a SOI substrate. The semiconductor material of the substrate is preferably silicon. The CMOS components are integrated in a thin, monocrystalline silicon layer, conventionally designated as a body silicon layer, which is arranged on an insulation layer. A via contact to the back side of the substrate is to be created from the top side of the body silicon layer.

Figure 1:
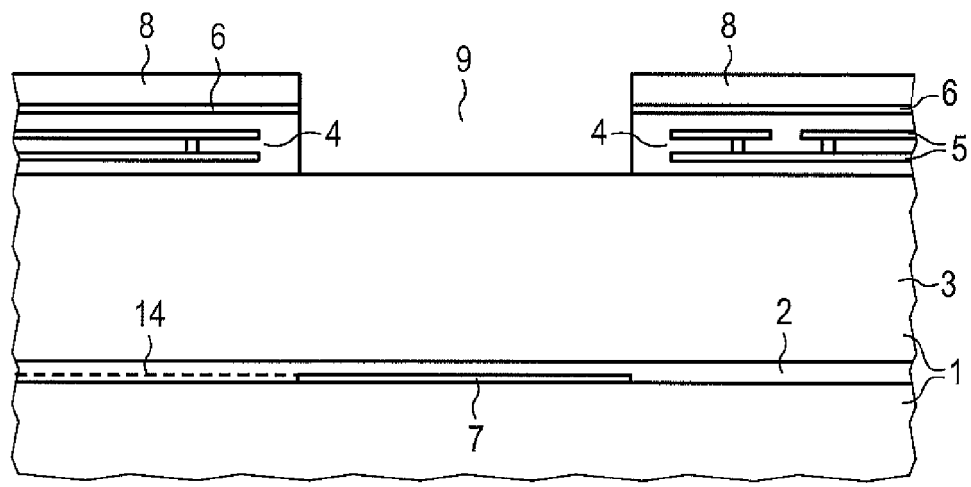
FIG. 1 shows a cross section through a first intermediate product of an embodiment of the method.

In the cross section of FIG. 1, an intermediate product of an embodiment is shown with a CMOS circuit including the associated wiring. The wiring is constructed in a typical way by multiple metal planes 5 that are separated from each other by an intermetal dielectric 4. For the electrical connection between conductor tracks of different metal planes, via contacts through the intermetal dielectric are provided. This is shown in the schematic in FIG. 1. The top side of the wiring is covered in the shown embodiment with a liner 6 that can be formed, for example, from Ti/TiN and preferably also covers a top side area provided with integrated components, for example, a CMOS circuit. The liner 6 can indeed be left out; an embodiment with a liner 6, however, has the advantage that the liner 6 can be used as an etching stop layer.

The substrate 1 has an insulation layer 2 that separates the substrate 1 into a top-side semiconductor layer 3 and a portion conventionally designated as bulk. In the case of a silicon substrate, the semiconductor layer 3 is designated as the body silicon layer. Within the insulation layer 2, according to the invention, a connection pad 7 made from an electrically conductive material, preferably a metal, is arranged. The connection pad 7 can be limited laterally, as shown in FIG. 1, to the area provided for the via contact, or instead could also be extended and optionally provided with an electrical connection to integrated components that could be arranged, for example, in the vicinity of the insulation layer 2 or in the bulk portion of the substrate. In this way, the connection pad 7 can be provided with an electrical feed line 14 arranged within the insulation layer 2 (drawn with dashed lines in FIG. 1 as another embodiment) that creates an electrical connection to a component integrated, for example, in the bottom portion of the substrate, in particular, a bulk silicon layer. The connection pad 7 allows an especially simple manufacture of the via contact according to the invention.

The shown arrangement can be manufactured, for example, by a known wafer bonding process. In the case of this process, two semiconductor substrates or wafers are used. The top side of the one substrate is provided with the insulation layer 2. Then the insulation layer 2 is permanently mounted on a top side of the other substrate. In this way, the layer sequence shown in the cross section in FIG. 1 is produced in which the insulation layer 2 is embedded in the semiconductor material on the top side and on the bottom side. In the case of this manufacturing method, the connection pad 7 is created and structured on one of the two top sides to be joined, so that, after the wafer bonding, the connection pad 7 is buried in the way shown in FIG. 1.

A mask 8 is applied and structured on the top side of the component. This mask is, for example, a photoresist mask that is formed relatively thick. By means of the mask 8, the opening 9 is etched into the layers of the liner 6 and the intermetal dielectric 4 present between the metal planes 5.

Figure 2:
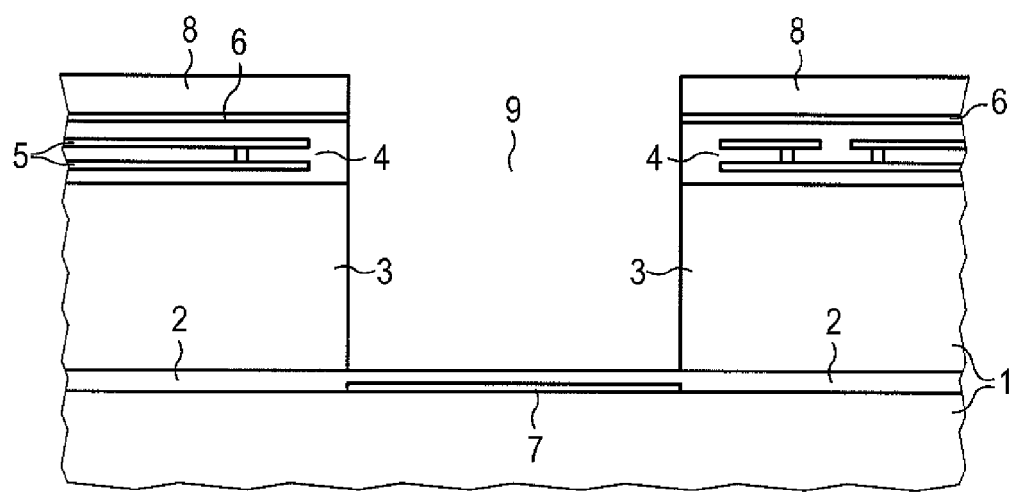
FIG. 2 shows a cross section according to FIG. 1 after the etching of an opening for the via contact.

FIG. 2 shows a cross section through an additional intermediate product after the etching of the semiconductor material up to the insulation layer 2. This etching step can be carried out by RIE (reactive ion etching), preferably by DRIE (deep reactive ion etching). The insulation layer 2 here functions as the etching stop layer. The opening 9 is thus formed corresponding to the cross section of FIG. 2 up to the insulation layer 2. The etching can be performed perpendicular to the top side of the substrate, that is, strongly anisotropically, in order to form the steepest possible side walls of the etched opening 9 and thus to limit the lateral extent of the opening 9 to the diameter required for the via contact.

Figure 3:
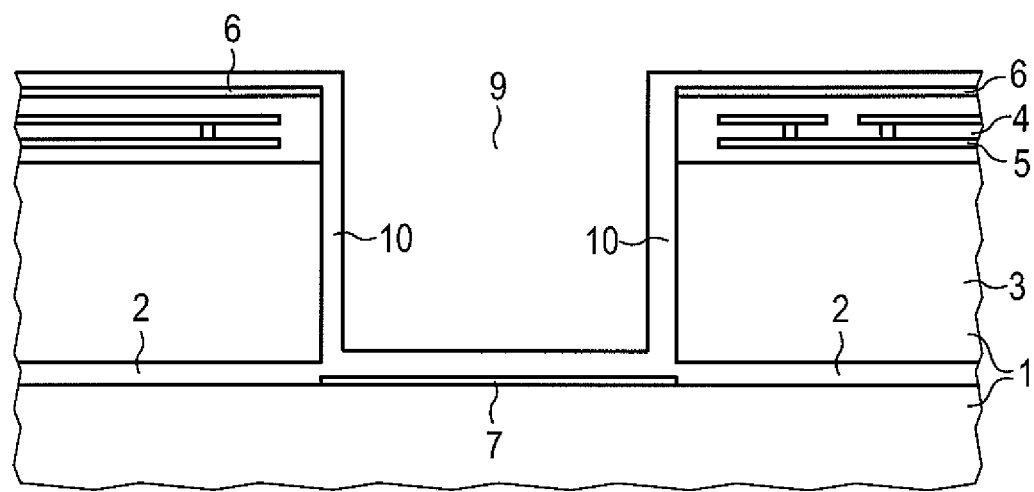
FIG. 3 shows a cross section according to FIG. 2 after the deposition of a dielectric layer.

FIG. 3 shows a cross section according to FIG. 2 for an additional intermediate product after the deposition of a dielectric layer 10. The dielectric layer 10 is deposited in the shown way initially on the entire surface area and can be, for example, an oxide of the semiconductor material, in particular, silicon dioxide. For the deposition of the dielectric layer 10, the CVD method (chemical vapor deposition), in particular, SACVD (sub-atmospheric chemical vapor deposition) is suitable. This method is known per se from semiconductor technology.

Figure 4:
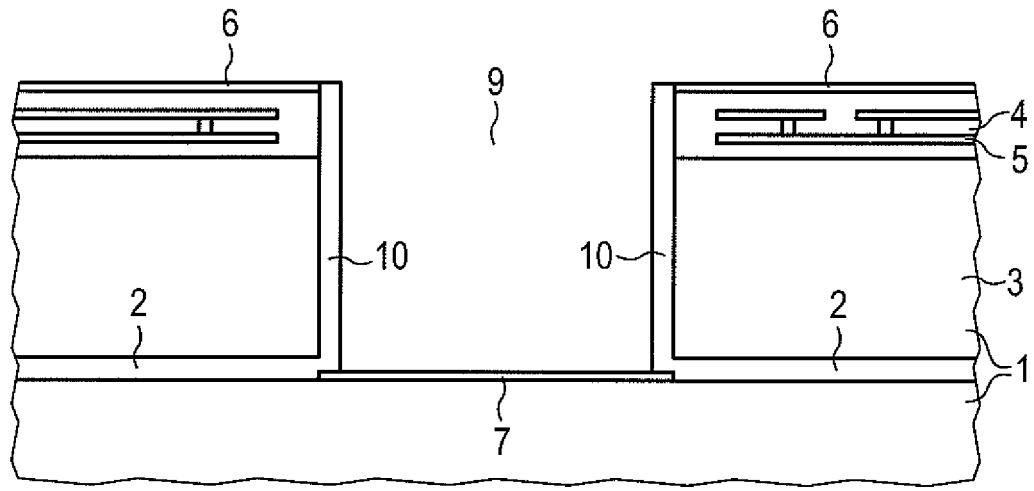
FIG. 4 shows a cross section according to FIG. 3 after the partial etching back of the dielectric layer.

The dielectric layer 10 is removed on the topside, that is, on the liner 6, and on the base of the opening 9, as is shown in cross section in FIG. 4. The dielectric layer 10 is therefore still present only on the side walls of the opening 9. In FIGS. 3 and 4, separating contours are left out between the insulation layer 2 and the dielectric layer 10 in order to indicate that both layers may be formed from oxide. Now the connection pad 7 is exposed on the base of the opening 9. The partial removal of the dielectric layer 10 can be performed, for example, by means of RIE. The dielectric layer 10 is therefore also removed, in particular, from the top side of the areas of the component provided with the CMOS circuit. The liner 6, in particular, a liner made from Ti/TiN, is here used as the etching stop layer. That is especially advantageous when an oxide of the semiconductor material is likewise used as the intermetal dielectric 4. The anisotropically performed etching allows the dielectric layer 10 on the horizontal surfaces to be completely removed, while the dielectric layer 10 on the side walls within the opening 9 remains at a thickness sufficient for insulation. The connection pad 7 is likewise used as the etching stop layer.

Figure 5:
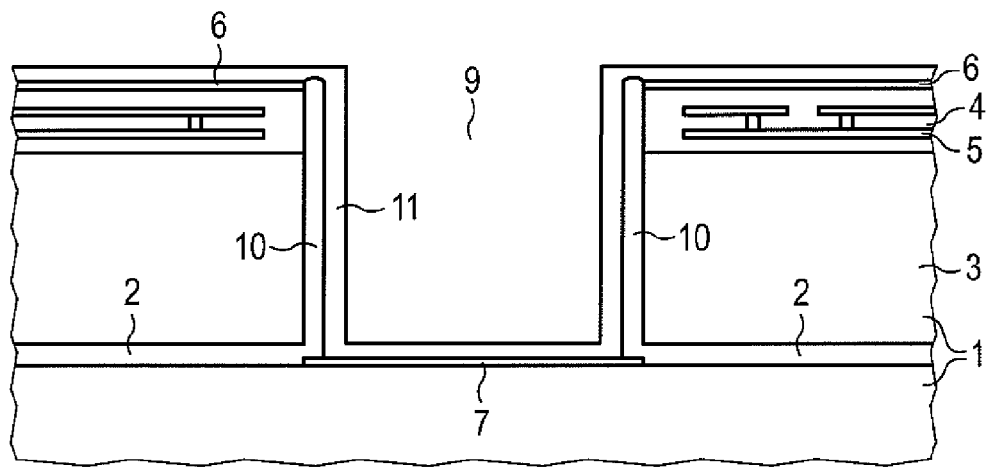
FIG. 5 shows a cross section according to FIG. 4 after the deposition of a metallization.

FIG. 5 shows an additional cross section according to FIG. 4 after the deposition of a metallization 11 that is initially created over the entire surface area like the dielectric layer 10. The metallization 11 can be created, for example, by isotropic MOCVD (metal-organic chemical vapor deposition) and is, for example, tungsten. The metallization 11 initially present over the entire surface area can then be etched back without the use of a mask. The process is performed in such a way that the etching rate on the top side is higher than on the base of the opening 9 and on the side walls. In this way it is achieved that sufficient metal remains on the base and the side walls of the opening 9 when the area of the CMOS circuit has been completely freed from the metallization 11.

Figure 6:
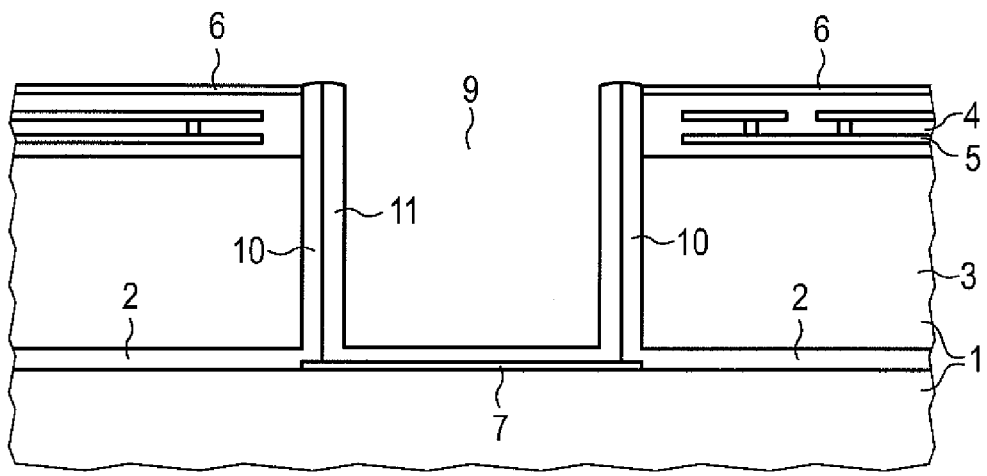
FIG. 6 shows a cross section according to FIG. 5 after a partial etching back of the metallization.

FIG. 6 shows a cross section according to FIG. 5 after the top-side removal of the metallization 11, of which now only a portion is still present on the base and on the side walls within the opening 9. Because the connection pad 7 has been exposed from the dielectric layer 10, on the base of the opening 9 there is now an electrical contact between the metallization 11 and the connection pad 7.

The metallization 11 can then be contacted on the top side by the deposition of a top-side connection metallization designated in the following as top metal. Therefore, any metal typically used for conductor tracks is suitable, in particular, for example, aluminum.

Figure 7:
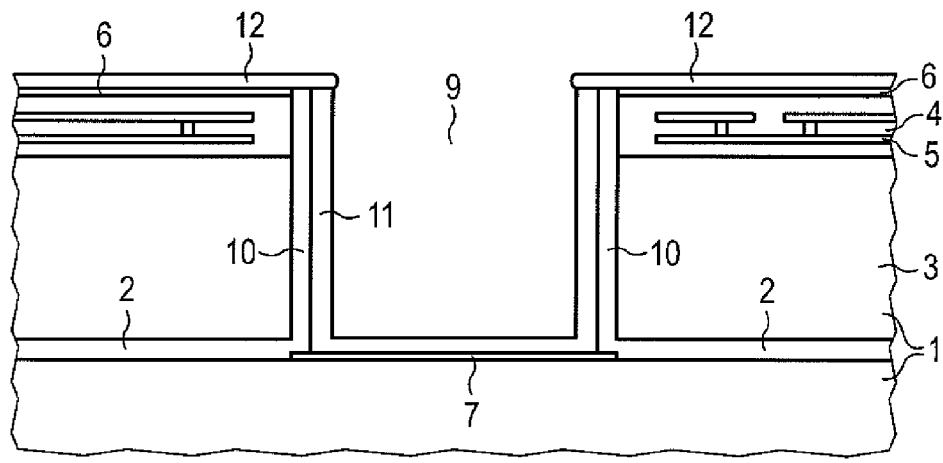
FIG. 7 shows a cross section according to FIG. 6 after the deposition of a top metal.

FIG. 7 shows a cross section according to FIG. 6 after the deposition of a layer of a top metal 12 that has, on the top edge that is formed by the edge of the opening 9, a bead, which can as well be formed larger or smaller than that shown in FIG. 7. In this way it is guaranteed that an electrically conductive connection is manufactured between the remaining portion of the metallization 11 and the top metal 12. The electrical connection between the metallization 11 and the top metal 12 is consequently already formed in situ for the deposition of the top metal 12. The top metal 12 is then structured corresponding to the provided electrical connections. Because the top side of the component is not planar due to the opening 9, for the structuring a resist mask is preferably used that is created by a spray coating, in particular by a method known as nanospray, in order to obtain a sufficiently uniform mask layer also in the area of the edges. The production of a suitable mask layer may eventually be supported by depositing the resist in a sufficient thickness.

Figure 8:
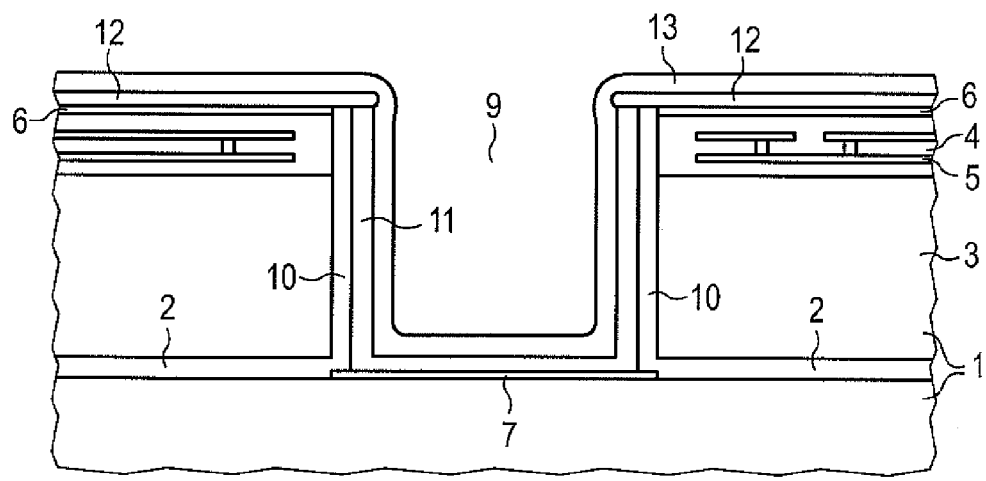
FIG. 8 shows a cross section according to FIG. 7 after the deposition of a passivation.

FIG. 8 shows a cross section according to FIG. 7 after the whole-surface-area deposition of a passivation 13. The passivation 13 is relatively thin in the shown embodiment and does not fill the opening 9. The passivation 13 can be a single layer or multiple layers and can be formed, for example, with an oxide layer, in particular, a silicon oxide layer, and a nitride layer deposited on top, in particular, a silicon nitride layer. The passivation 13 may be deposited by means of a standard PECVD process (plasma-enhanced chemical vapor deposition) or also by means of a SACVD process (sub-atmospheric chemical vapor deposition). Layers of a multiple-layer passivation 13 could also be deposited in part by PECVD and in part by SACVD. The passivation 13 can also be structured under the use of a resist mask.

For embodiments with multiple-layer passivation 13, optionally the properties of the relevant materials important for tempering steps, for example, the coefficients of thermal expansion, are taken into account in the sequence of the entire process. Otherwise, it could happen that cracks appear in the passivation 13 or that the passivation 13 peels from the bottom layer, which can occur on the metallization 11 mainly in the area of the side wall of the opening 9. That must be avoided when tempering steps are performed in which the component is heated to a temperature of typically 400° C. to 500° C., for example, in order to saturate so-called "dangling bonds" of the silicon in the area of integrated components, which is performed under a forming-gas atmosphere (for example, under a mixture of hydrogen and nitrogen) and is designated as "forming gas alloy." For such embodiments, the tempering step has preferably already been performed before the passivation is deposited or, in any case, before an additional layer made from different material is deposited on a layer of the passivation 13, that is, in the described example, the nitride layer on an oxide layer, or an additional layer created with a different method (for example, SACVD instead of PECVD) is deposited. Thus, the tempering step is preferably performed in embodiments with layers of different thermal properties before the passivation 13 is deposited or has been completely deposited, so that, in each case, it is deposited before the last layer of the passivation 13 is created.

Starting from the structure shown in cross section in FIG. 8, the via contact can be completed in a simple way in that a recess is created from the back side in the area of the connection pad 7 with which the back side of the connection pad 7 is exposed. There, an additional metallization can be deposited that creates a continuous, electrically conductive connection between the top metal 12 and the back side of the substrate 1. The described method is considerably simplified relative to the prior art in view of the masks required for the structuring of the front-side and back-side metal contacts of the via contact.

In comparison with a standard CMOS process, no additional masks are required for the described method, with the exception of the etching step for the production of the opening 9. The method is therefore suitable especially for the production of CMOS components with via contacts through the substrate. The structure of the component is characterized by the conductive connection of the via contact that does not fill the opening 9, but instead is present only on the side walls, as well as by the buried connection pad 7. This structure has the special advantages that the ohmic resistance of the via contact is especially low due to the comparatively very large surface area of the side wall of the opening used for this purpose and that the passivation 13 can be deposited by means of a standard PECVD process and optionally a SACVD process.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A method for the manufacture of a semiconductor component, comprising:
   providing a substrate made from a semiconductor material with a buried insulation layer and a connection pad made from an electrically conductive material arranged in the insulation layer;
   creating an opening extending from a top side of the substrate up to the insulation layer above the connection pad;
   depositing a dielectric layer;
   removing the dielectric layer and the insulation layer within the opening to an extent that a top side of the connection pad is exposed;
   depositing a metallization that contacts the connection pad; and
   manufacturing a via contact extending from a back side of the substrate opposite the opening up to the connection pad.

2. The method according to claim 1, wherein the opening is formed with a vertical side wall by an anisotropic etching process.

3. The method according to claim 1, wherein the metallization is removed outside of the opening, and wherein a top metal is deposited such that the top metal contacts the top edges of the metallization.

4. The method according to claim 1, wherein the metallization is initially manufactured over the entire surface area and then etched back at an etching rate that is higher on the top side than on the base and on the side walls of the openings, so that a portion of the metallization remains on the base of the opening.

5. The method according to claim 1, wherein the top side of the substrate is provided with an intermetal dielectric and metal planes of a wiring before the etching of the opening,
   wherein the top side of the intermetal dielectric is covered with a liner, and
   wherein the material of the liner is selected so that the liner functions as an etching stop layer for the partial removal of the dielectric layer.

6. The method according to claim 1, wherein the substrate is manufactured such that a first semiconductor body is provided on a top side with an insulation layer,
   wherein a second semiconductor body is mounted on the insulation layer, and
   wherein, before the connection of the semiconductor body, a connection pad is deposited on the insulation layer or on the top side of the second semiconductor body to be connected to the insulation layer.

7. The method according to claim 1, wherein a passivation is manufactured on the metallization.

8. The method according to claim 7, wherein the passivation is manufactured from at least two layers of different materials.

9. The method according to claim 8, wherein a tempering step is carried out only before the last layer of the passivation has been deposited.

10. The method according to claim 7, wherein the passivation is manufactured such that an oxide layer is initially deposited and a nitride layer is deposited on the oxide layer.

11. The method according to claim 7, wherein a tempering step is carried out only before the passivation is deposited.

* * * * *